United States Patent [19]
Hall

[11] Patent Number: 6,032,524
[45] Date of Patent: Mar. 7, 2000

[54] METHOD AND APPARATUS FOR DETECTING P-STATIC INTERFERENCE SOURCE

[75] Inventor: Allen L. Hall, Wichita, Kans.

[73] Assignee: Raytheon Aircraft Company, Wichita, Kans.

[21] Appl. No.: 08/984,336

[22] Filed: Dec. 3, 1997

[51] Int. Cl.[7] .................................................. G01R 31/00
[52] U.S. Cl. .................... 73/178 R; 324/409; 324/410
[58] Field of Search .......................... 73/178 R; 324/409, 324/410, 122

[56] References Cited

U.S. PATENT DOCUMENTS 4,609,866   9/1986   Loftness.

FOREIGN PATENT DOCUMENTS

| 0520193 | 12/1992 | European Pat. Off. . |
| 2184500 | 12/1973 | France . |
| WO 97/00729 | 1/1997 | WIPO . |

OTHER PUBLICATIONS

Manual by Raytheon Aircraft Company enetitled: "Operation and Maintenance Manual for Electrostatic Diagnositic Test Set,"(publication date unknown).

International Search Report dated Apr. 7, 1999 (PCT/US98/25329) (RAYT:009P).

Joffe, "Ground testing of an operational fighter aircraft for p–static discharge effects," *Proceedings of International Symposium on Electromagnetic Compatibility*, pp. 288–292, San Diego, CA, Sep. 16–18, 1986.

*Primary Examiner*—William Oen
*Attorney, Agent, or Firm*—Arnold White & Durkee

[57] ABSTRACT

The detection of components that cause p-static interference with communications and navigation equipment is essential to the maintenance of an aircraft. A p-static source locator uses two leads to supply a voltage between components of the aircraft. If the components are not properly electrically bonded, a radio receiver detects the p-static interference created when sparking occurs between the inadequately bonded components. The p-static source locator may be implemented in a single hand-held unit that is simple to transport and use. Moreover, the locator uses low voltage potential differences for operator safety.

19 Claims, 6 Drawing Sheets

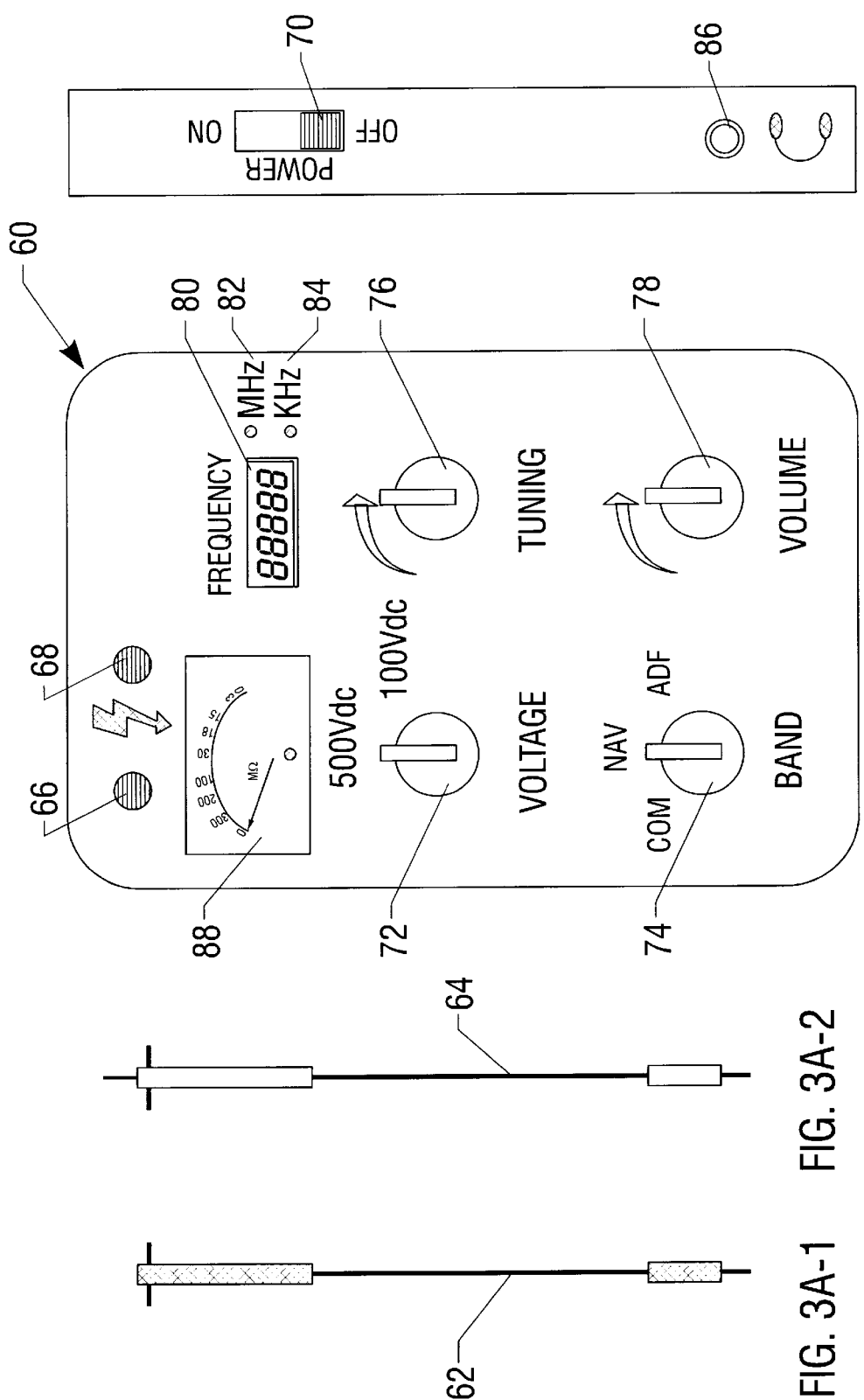

METHOD AND APPARATUS FOR DETECTING P-STATIC INTERFERENCE SOURCE

BACKGROUND OF THE INVENTION

The present invention relates to the detection of sources of p-static interference. More particularly, the invention relates to a method and apparatus for detecting p-static interference caused by inadequate electrical bonds between components of an aircraft.

P-static (or "Precipitation" static) is a result of triboelectric charging of an isolated body. Triboelectric charging is a phenomenon that produces static electricity by friction. The charge transfer may take place, for example, when particles (rain, ice, dust, sand, etc.) impinge an isolated surface and charge the surface to a higher potential than the surrounding area. The phenomenon is often seen on aircraft when rain or ice impinge the aircraft and leave an overall negative charge on the aircraft. If unaccounted for, the charge on the aircraft often reaches an electrical potential at which the aircraft discharges to the atmosphere by corona, sparking, or streamering. The charge build-up may also cause sparking between inadequately electrically bonded components of the plane. This corona, sparking, and streamering causes radio frequency interference which can degrade the operation of electrical and radio equipment onboard the aircraft. This radio frequency interference noise is typically referred to as precipitation static or p-static.

P-static interference is typically controlled through the use of static dischargers and proper electrical bonding. Static dischargers slowly disperse excess charge on an aircraft back to the atmosphere without creating corona, sparking, or streamering. Further, proper electrical bonding ensures that the aircraft components that are exposed to triboelectric charging are at a common voltage potential relative to each other so that differential voltages are not created between inadequately bonded components.

When p-static interference occurs in an aircraft, it is important that the source of the static be located. Prior apparatus and methods for locating the source of p-static interference have included the use of high voltage (approximately 70,000 volts DC) test sets that flood an aircraft with highly charged ions. During application of this voltage, the radio receiver on the aircraft is monitored for the appearance of interference.

These methods and apparatus, however, suffer from a number of disadvantages. First, these test systems use dangerous voltage levels that can injure a test operator if proper procedures are not followed. Second, the test apparatus is typically large, bulky, and expensive, thereby limiting its widespread use. Third, the test results have been known to be susceptible to false detection of inadequate bonds as possible sources of p-static interference.

Accordingly, a need has arisen for a p-static source locator that is less susceptible to false readings. It is also desirable that the locator be less expensive, and that it operate at lower voltages. The present invention not only addresses these needs, but also provides a system that is more compact and easier to use than existing systems.

SUMMARY OF THE INVENTION

The present invention provides an improved method and apparatus for locating components on a moving vehicle that are not adequately electrically bonded to prevent p-static interference. This process involves a low voltage ohm meter and a radio receiver. The ohm meter operates at voltages far below 70,000 volts, and therefore provides a materially safer environment. The ohm meter probes are applied across adjacent components of the aircraft while the radio is tuned to a frequency in the radio frequency band. If adjacent components are not adequately electrically bonded, the voltage from the ohm meter will spark across an interface between the components and create radio frequency interference that can be heard in the radio. The noise heard on the radio sounds like a loud high frequency screeching or whining. This screeching and whining noise is very similar to the noise heard on the COM, NAV, and ADF frequency bands of radios used on aircraft experiencing p-static interference.

In one embodiment, the apparatus components of the invention are integrated into a single hand-held unit. Therefore, it is possible for the unit to be quickly and easily moved from one point on an aircraft to another, or from one location to another location. The testing of the aircraft, moreover, can be performed without using the radio equipment of the aircraft itself.

In another aspect, the invention includes a method for detecting p-static interference. The invention contacts one component of an aircraft with one probe of the ohm meter, and another such component with the other probe of the ohm meter. The two components will simulate p-static interference due to arcing or sparking when the components are inadequately bonded. A radio receiver is proximately located to the aircraft for detecting the p-static interference. In operation, the radio receiver is tuned to a radio frequency of interest in the NAV, COM, or ADF bands.

The apparatus components of the invention are readily available from a number of suppliers and are well-known in the art. Methods of operating the individual components used in the present invention are similarly well understood in the art.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 3 illustrates an embodiment of the p-static locator implemented as a hand-held unit.

DESCRIPTION OF ILLUSTRATIVE EMBODIMENTS

Figure 1A:
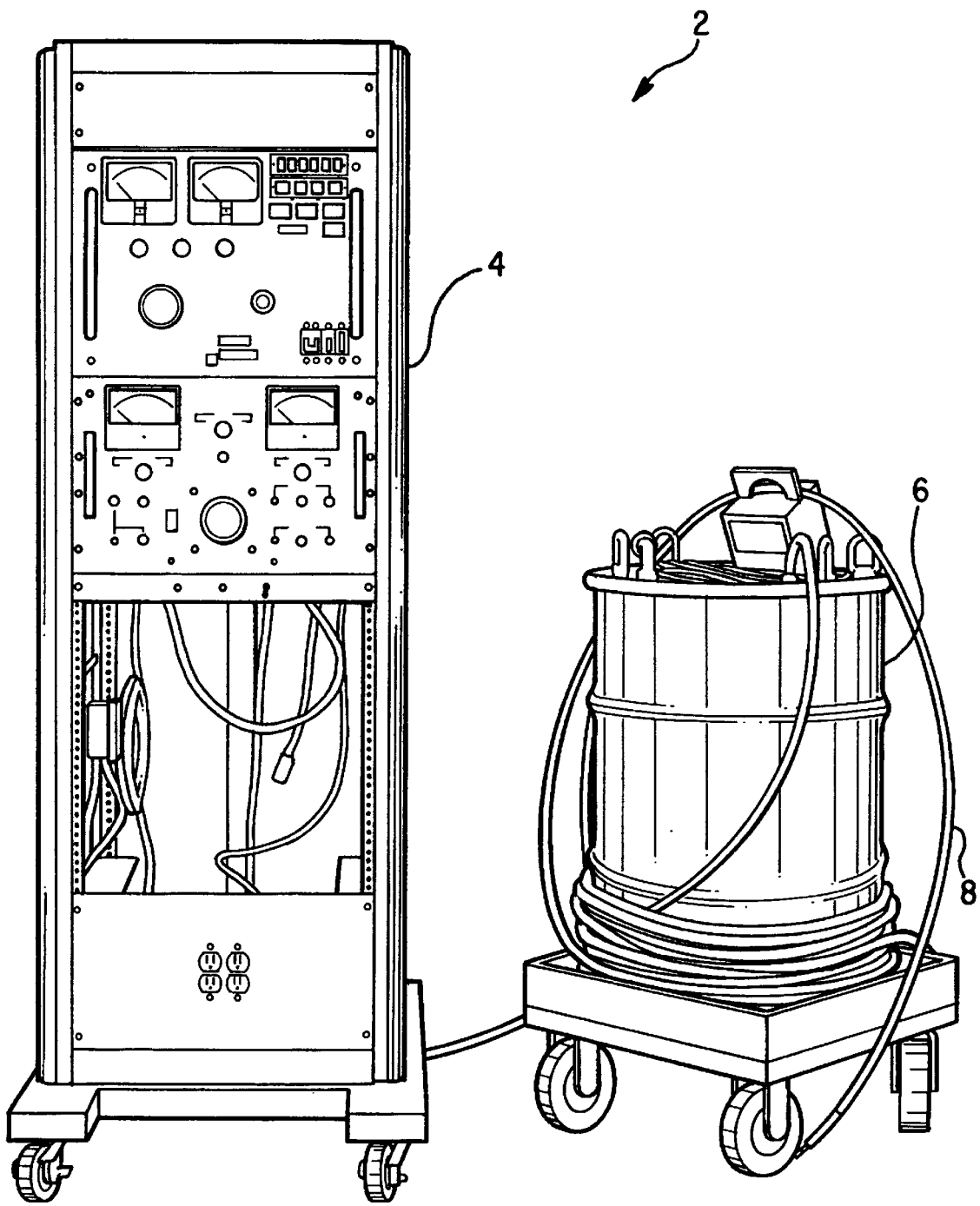
FIGS. 1A and 1B illustrate prior art devices for determining the source of p-static interference.
Figure 1B:
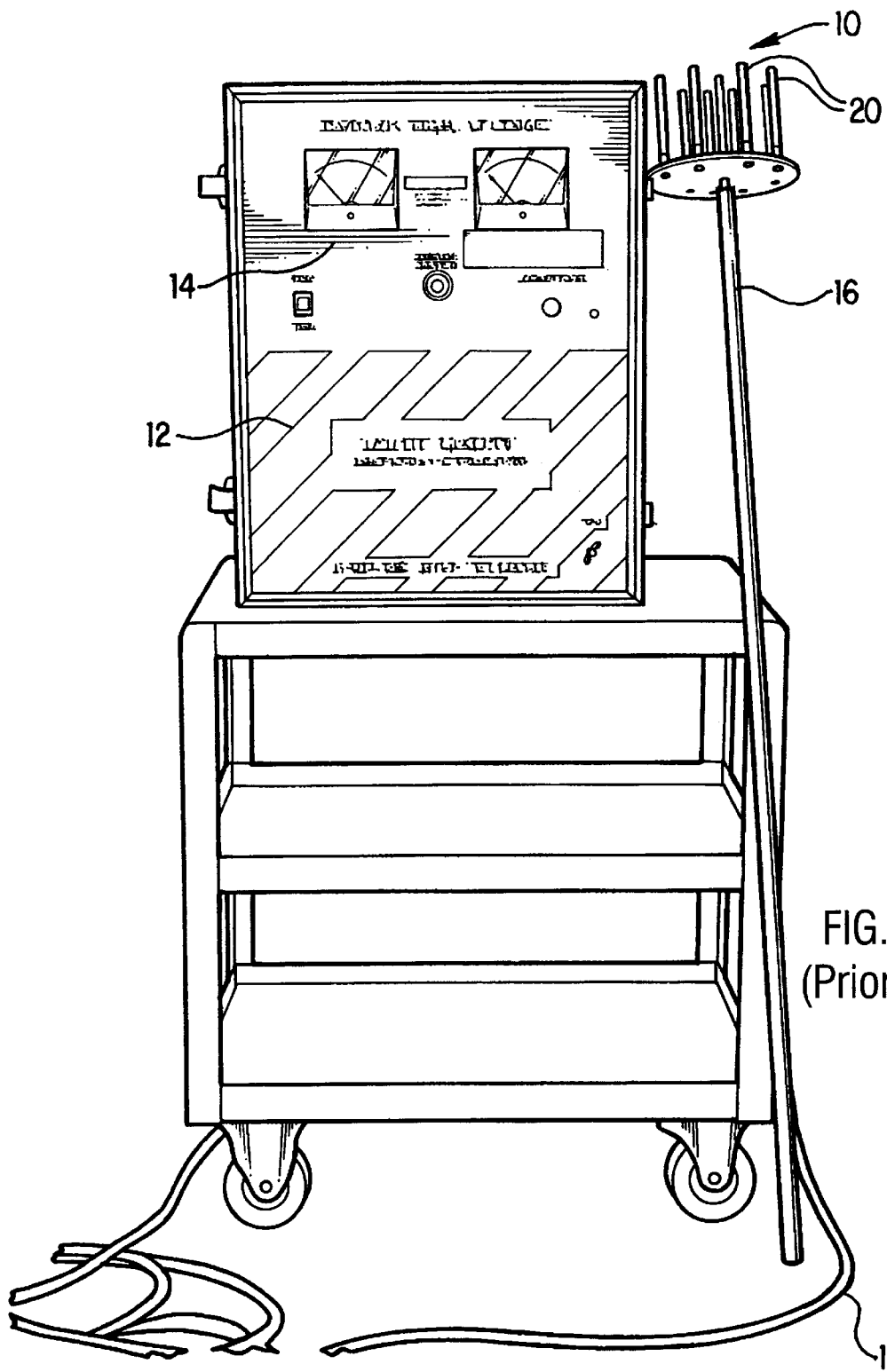

FIGS. 1A and 1B illustrate prior p-static source locators. FIG. 1A illustrates a Universal Electronics Corporation High Voltage P-Static Test Set (Model No. BAL-70-25). The Universal Electronics unit 2 consists of two large components, high voltage power supply 4 and a drum-shaped high voltage capacitive charging unit 6. The instrument panel on the power supply 4 permits the user to control the voltage level of the unit. The drum-shaped charging unit 6 includes a wire 8 to connect the charging unit 6 to an aircraft or a vehicle under test. The term aircraft, as used by the inventor, includes any object or vehicle that may be subject to p-static interference. For example, the term aircraft includes flying objects such as aircraft, missiles, and rockets.

In operation, the Universal Electronics test unit requires someone to enter the plane and monitor the navigation information and communications during testing. The charging unit 6 is connected to an aircraft and is charged to approximately 70,000 volts DC. The communications equipment on the aircraft is used to detect p-static interference due to inadequate bonding. However, as previously discussed, this method and apparatus suffers from several deficiencies. In particular, the Universal Electronics test unit is large and bulky, and operates at dangerous voltages. Moreover, the Universal Electronics unit is not capable of isolating the source of the p-static interference. It merely indicates the existence of inadequately bonded components.

FIG. 1B illustrates another prior apparatus for determining the source of p-static interference. The Dayton-Granger Electrostatic Diagnostic Test Set 10 (Model No. 120-60KV) comprises a voltage source 12 with user interface 14. A wand 16 extends from the voltage source 12 via cable 18. The wand 16 includes several wicks 20 that emit electrons to charge an aircraft.

In operation, a test is performed by walking the test set 10 around an aircraft and bombarding the object with electrons using the high-voltage source 12 (supplying approximately 60,000 volts). Although the Dayton-Granger unit 10 is better suited than the Universal Electronics test unit (FIG. IA) for isolating the source of p-static interference, it still suffers from many of the same disadvantages of other prior test units. For example, the Dayton-Granger unit requires the use of high voltages, and is expensive and bulky. The test unit 10 is also susceptible to false positive readings due to improper positioning of the wand 16. For example, interference may occur if the wand 16 is placed too close to an aircraft antenna, resulting in a false positive reading due to the noise generated by the wand 16 itself.

Figure 2A:
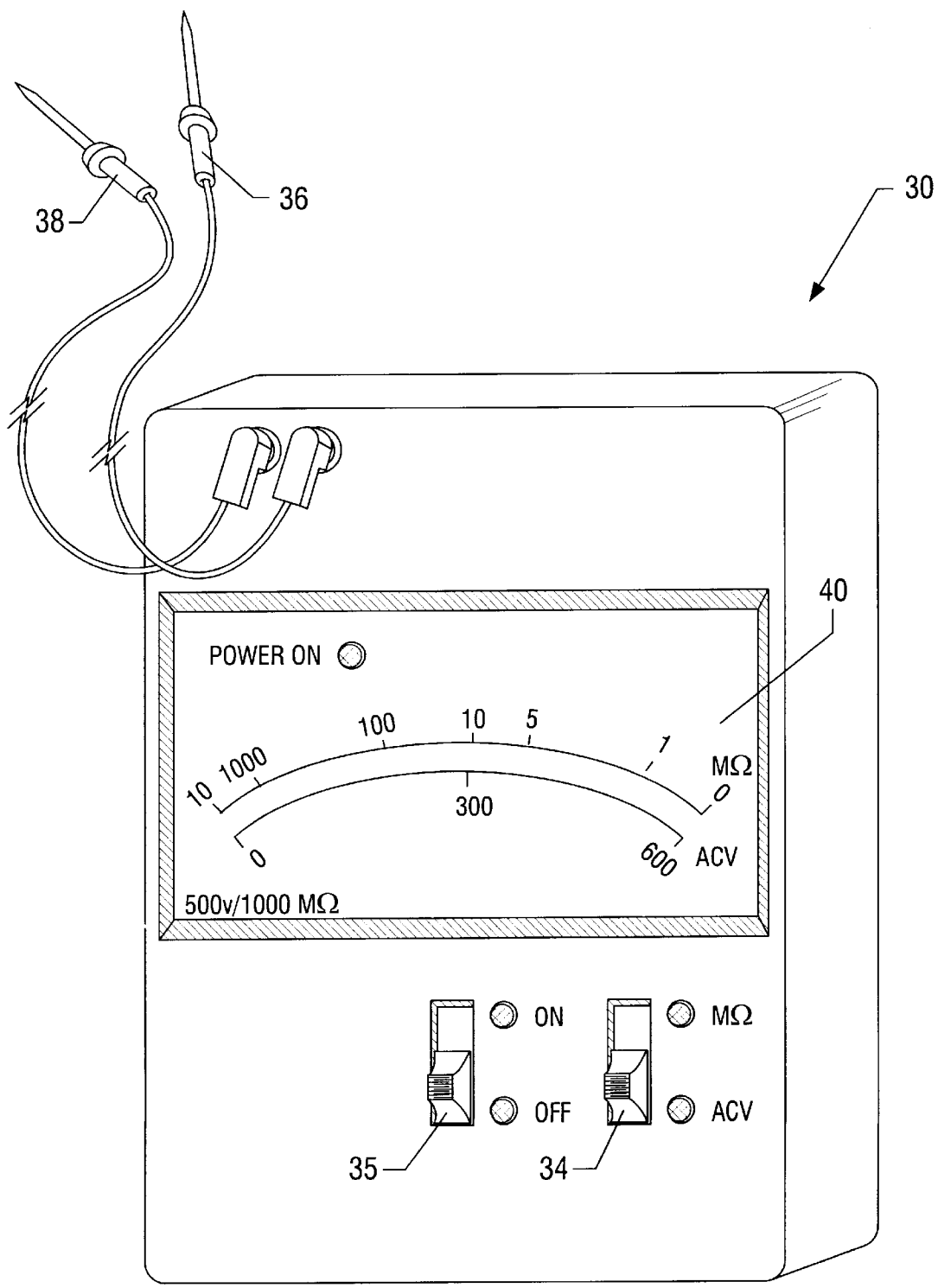
FIG. 2 illustrates an embodiment of the present invention utilizing a radio and an ohm meter.
Figure 2B:
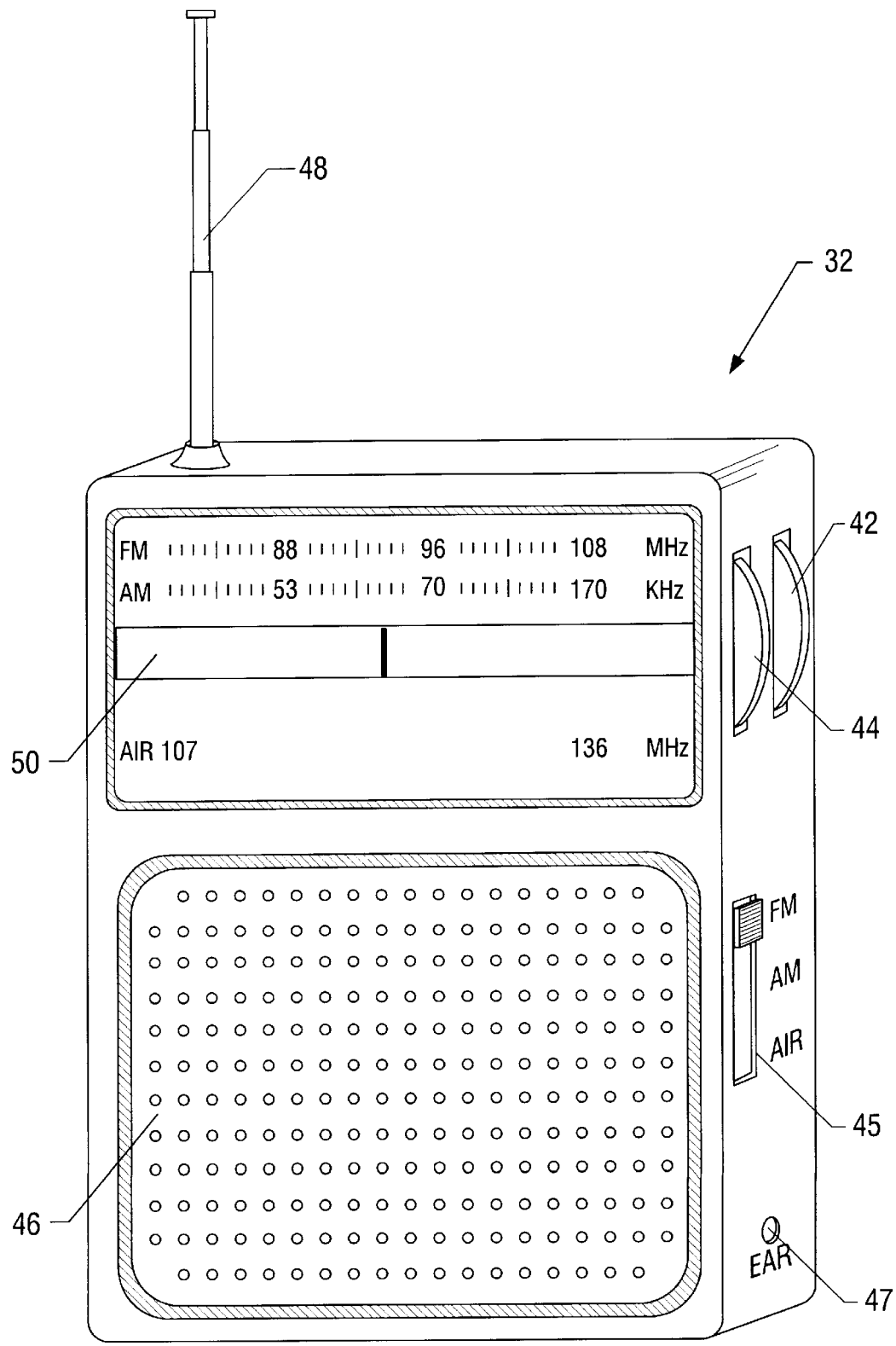

FIG. 2 illustrates an embodiment of the present invention. The test system comprises a 500V megohm meter 30 and a radio receiver 32. The megohm meter 30 is a BK Precision Model 305 Electronic Insulation Tester. The megohm meter 30 includes a switch 34 for selecting the operation of the meter to measure resistance (in megohms) or potential (in AC volts). Switch 35 permits the megohm meter to be turned on and off. When operating in the mode to measure resistance, the meter 30 provides a potential difference between a first lead 36 and a second lead 38. For the BK Precision megohm meter, the potential difference is approximately 500 volts. The display 40 indicates the resistance measured by the meter 30 between the first lead 36 and the second lead 38. Although the present invention is described in terms of a megohm meter from BK Precision, it should be readily apparent to a person of ordinary skill in the art that any megohm meter or ohm meter may be used without departing from the scope and spirit of the present invention. Moreover, it should also be readily apparent to a person of ordinary skill in the art that the megohm meter may be replaced with any low voltage potential source. The present invention contemplates that a the potential source be operable to provide a potential difference sufficient to create p-static interference between improperly bonded components, but still operate at a safe operating voltage.

The system also includes a radio receiver 32 for detecting p-static interference. In an embodiment of the present invention, the radio receiver is a Radio Shack Receiver, Catalog No. 12-615, readily available from Radio Shack. The radio receiver 32 includes a volume control 42, a tuning control 44, a frequency band select switch 45, a speaker 46, an antenna 48, and a display 50.

The volume control 42 permits the speaker 46 output level to be controlled. In addition, volume control 42 controls the output to audio terminal 47 when headphones are used with radio receiver 32. The volume control 42 also turns the radio on and off. The tuning control 44 permits the radio to be tuned to a particular frequency. The frequency band select switch allows a user to select the frequency band of interest. The display 50 displays the currently tuned frequency. The antenna 48 receives radio signals (including any interference) at the tuned frequency and provides the signal to the radio for output at speaker 46 or audio terminal 47. Although the prescribed embodiment contemplates the use of the a Radio Shack radio, other radios that are operable to receive radio frequency signals may be used without departing from the spirit and scope of the present invention.

In operation, the test system may be used to detect the source of p-static interference between components of an aircraft or between components of the aircraft and the aircraft frame. A potential difference is applied to components on an aircraft by placing the first lead 36 on a first component of an aircraft and by placing the second lead 38 on a second component of the aircraft. If the components on the aircraft are not properly bonded, a potential difference builds up between the components. Once the potential difference reaches a critical point, sparking across the components occurs. This sparking creates p-static interference, which typically is created across the entire radio frequency band.

A radio receiver 32 is located near the components under test, and detects any interference created at the tuned frequency via antenna 48. The received signal, along with any detected interference, is output to the speaker 46. As previously discussed, the detected signal will sound like a high frequency screeching or whining. To further facilitate detection of the interference signal, the radio receiver 32 may be tuned using the tuning circuit 44 to an unused frequency. Although it is desirable to select an unused frequency, it is not required. Because p-static interference is typically created across the entire radio frequency band, any radio frequency may be used to detect the interference signal.

In addition to providing an audio indication of a source of p-static interference, the megohm meter also supplies a visual indication at display 40 when components may not be properly bonded. For example, when two components are properly bonded, the ohm meter will indicate a low impedance between the components. However, when the components are not properly bonded, the ohm meter will indicate a high impedance between the components. The display 40 may be any conventional display for indicating impedance, including a pointer (as illustrated) or a digital numeric display.

FIG. 3 illustrates another embodiment of the present invention in which the p-static source locator 60 comprises a single unit. The single unit locator 60 is designed to be light-weight and portable for ease of transportation and use. The single unit design enables the user to walk around the plane and test various areas of the plane. In addition, the unit may be carried on an aircraft for use at remote locations that may not have p-static interference test equipment available. The locator 60 includes a first lead 62 and a second lead 64. The first lead 62 is connected to the locator 60 at ground terminal 66. The second lead 64 is connected to the locator 60 at voltage terminal 68, thereby creating a potential difference between the two leads. The locator 60 may be operated using batteries, and is turned on and off by switch 70.

The single unit locator 60 includes a voltage control 72, a frequency band select 74, a fine tuning control 76, and a volume control 78. The voltage control 78 allows a user to select the voltage to supply at leads 62 and 64. In the illustrated embodiment, the user may select either 500 V dc or 1000 V dc.

The locator 60 may be designed to detect p-static interference in any radio frequency. In the illustrated embodiment, the locator may be configured via frequency band select 74 to receive signals from a particular band. Within that frequency band, the locator may be tuned to an unused frequency by using the fine tuning control 76. The illustrated embodiment supports the following frequency bands: COM, NAV, and ADF. The COM band is the standard VHF communications band for the radio on an aircraft. This frequency band ranges from 118.0 MHz to approximately 151.975 MHz. The NAV band is the frequency band used by the navigational equipment on an airplane. This frequency band ranges from 108.0 MHz to 117.95 MHz. Finally, the ADF (Automatic Direction Finding) band is the frequency band used to support the automatic direction finding equipment. This frequency band ranges from approximately 190 kHz to 1710 kHz. The selected frequency band is displayed at the display 80. LED 82 and LED 84 display whether the frequency displayed at display 80 is in MHz or kHz.

The locator 60 outputs the signal received at the currently selected frequency through terminal 86. The terminal 86 is a standard audio terminal to which a set of headphones or speakers may be connected. In other embodiments of the invention, the locator 60 may include a speaker.

Figure 4:
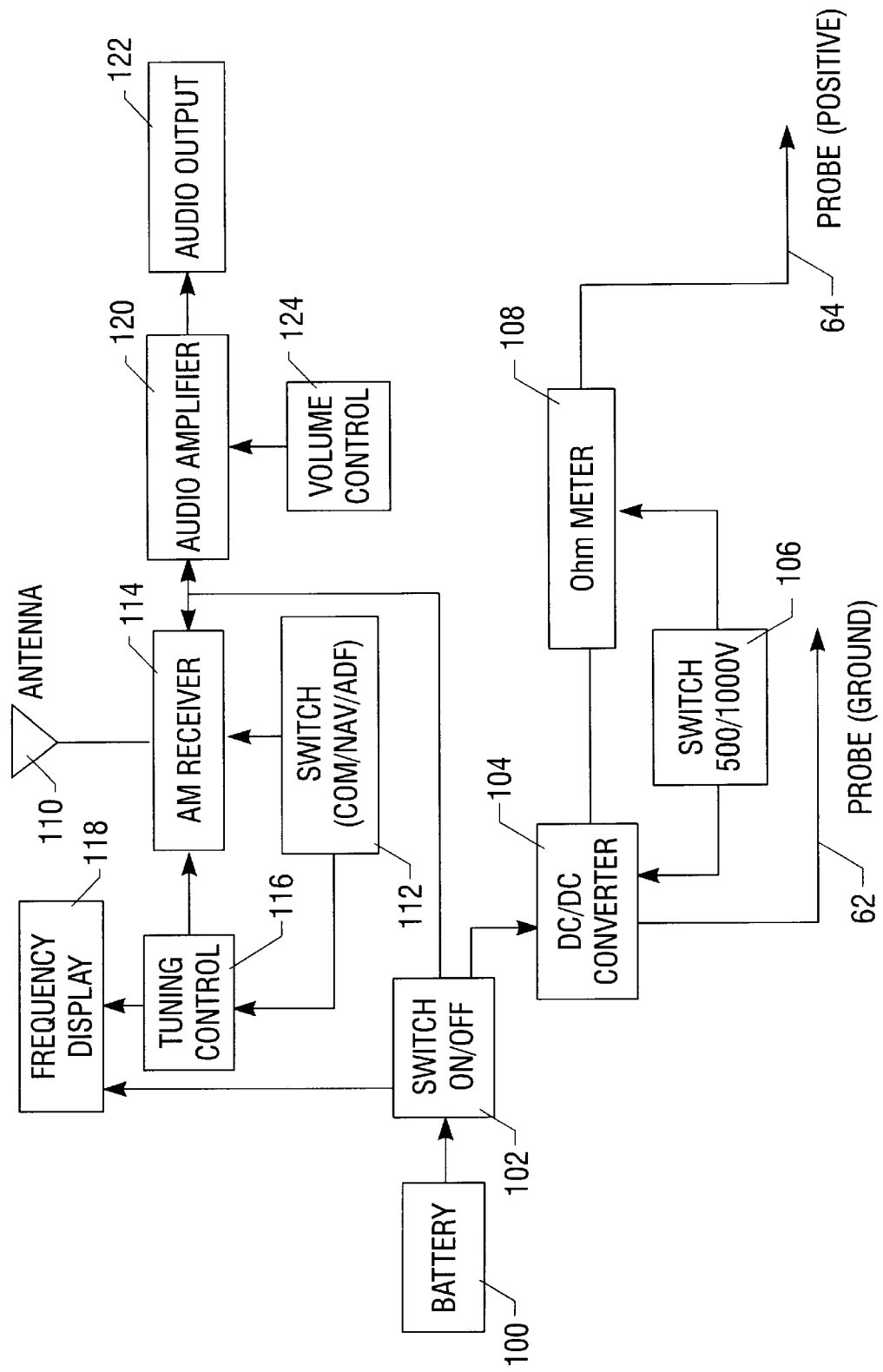
FIG. 4 is a block diagram of the major components of the p-static locator of the present invention.

FIG. 4 is a block diagram of the major components of the p-static locator of the present invention. Power is supplied to the locator by battery 100 via On/Off switch 102. DC/DC Converter 104 converts the voltage from battery 100 and provides either a 500 V or 1000 V potential difference between probes 62 and 64. Switch 106 selects the potential difference. Ohm meter 108 is operable to measure the impedance between probes 62 and 64.

On/Off switch 102 also controls supplying power to the radio frequency components of the p-static locator. Antenna 110 and receiver 114 receive signals at the selected frequency bands. These frequency bands are selected via switch 112. As previously described, the p-static locator may include capabilities to receive data in the COM, NAV, and ADF bands. A tuning control 116 is provided for tuning the receiver 114 within the frequency band selected by switch 112. The selected frequency is displayed at frequency display 118.

The signal received at receiver 114 is provided to an audio amplifier 120. The audio amplifier 120 amplifies the received signal based on the volume selected by volume control 124. The amplified signal is provided to audio output 122. The audio output 122 may be any well known output, including a speaker or a standard audio terminal.

All of the methods and/or apparatus disclosed and claimed herein can be made and executed without undue experimentation in light of the present disclosure. While the devices and methods of this invention have been described in terms of specific embodiments, it will be apparent to those of skill in the art that variations may be applied to the methods and/or apparatus and in the steps or in the sequence of steps of the method described herein without departing from the concept, spirit, and scope of the invention. Therefore, all such substitutions and modifications apparent to those skilled in the art are deemed to be within the spirit, scope, and concept of the invention as defined by the appended claims.

What is claimed is:

1. An apparatus for detecting the source of p-static interference between components of an aircraft comprising:
    an ohm meter having a first lead and a second lead, wherein said ohm meter is operable to supply a low voltage potential difference between said first and second leads; and
    a radio receiver proximately located to said ohm meter and operable to detect p-static interference caused when two components of the aircraft are charged to a potential difference by said first and second leads.

2. The apparatus of claim 1, wherein said ohm meter is a megohm meter.

3. The apparatus of claim 1, wherein said ohm meter provides a potential difference of about 500 volt DC.

4. The apparatus of claim 1, wherein said ohm meter provides a potential difference of about 1000 volt DC.

5. The apparatus of claim 1, wherein said radio receiver operates in the AM, FM, or VHF band.

6. The apparatus of claim 1, wherein said radio receiver operates in the ADF band.

7. The apparatus of claim 1, wherein said radio receiver operates in the COM band.

8. The apparatus of claim 1, wherein said radio receiver operates in the NAV band.

9. A method for detecting the source of p-static interference between components of an aircraft comprising:
    providing a radio receiver operable to receive signals in the radio frequency band;
    proximately locating the radio receiver to the aircraft;
    creating a low voltage potential difference between two components of the aircraft; and
    detecting at the radio receiver any interference signal generated by sparking between the two components.

10. The method of claim 9, further comprising tuning the radio receiver to a preselected frequency.

11. The method of claim 10, wherein the preselected frequency is in the AM, FM, or VHF band.

12. The method of claim 10, wherein the preselected frequency is in the ADF band.

13. The method of claim 10, wherein the preselected frequency is in the COM band.

14. The method of claim 10, wherein the preselected frequency is in the NAV band.

15. A p-static source locator for locating the source of p-static interference between components on an aircraft comprising:
    a low voltage potential source;
    a first lead connected to said potential source;
    a second lead connected to said potential source, wherein said second lead is charged to a different potential than said first lead;
    a radio receiver proximately located to said potential source and capable of detecting interference created when said first test lead is applied at a first component on the aircraft and said second test lead is applied to a second component of the aircraft.

16. The p-static source locator of claim 15, wherein said low voltage potential source provides a potential difference of 500 volt DC.

17. The p-static source locator of claim 15, wherein said low voltage potential source is a megohm meter.

18. The p-static source locator of claim 15, wherein said low voltage potential source provides a potential difference of 1000 volt DC.

19. A hand-held, single-unit, p-static source locator comprising:
- a first lead adapted to be coupled to ground;
- a second lead operable to provide a potential difference from said first lead;
- a voltage control for setting the potential difference between said first and said second leads;
- a radio receiver;
- a frequency band select control for selecting the radio frequency band of the radio receiver;
- a fine tuning control for selecting a frequency within the radio frequency band;
- an output terminal operable to provide a signal output at the selected frequency; and
- a volume control for controlling the signal level of the signal output.

* * * * *